(12) United States Patent
Lee

(10) Patent No.: US 9,337,232 B2
(45) Date of Patent: May 10, 2016

(54) SUBSTRATE STACKED IMAGE SENSOR HAVING A DUAL DETECTION FUNCTION

(71) Applicant: SiliconFile Technologies Inc., Seongnam-si, Gyeonggi-do (KR)

(72) Inventor: Do Young Lee, Seongnam-si (KR)

(73) Assignee: SiliconFile Technologies Inc., Gyeonggi-do (KR)

( * ) Notice: Subject to any disclaimer, the term of this patent is extended or adjusted under 35 U.S.C. 154(b) by 0 days.

(21) Appl. No.: 14/359,264

(22) PCT Filed: Nov. 8, 2012

(86) PCT No.: PCT/KR2012/009409
§ 371 (c)(1),
(2) Date: May 19, 2014

(87) PCT Pub. No.: WO2013/073796
PCT Pub. Date: May 23, 2013

(65) Prior Publication Data
US 2014/0327061 A1   Nov. 6, 2014

(30) Foreign Application Priority Data

Nov. 17, 2011  (KR) .......................... 10-2011-0120540

(51) Int. Cl.
*H01L 27/146* (2006.01)

(52) U.S. Cl.
CPC ...... *H01L 27/14647* (2013.01); *H01L 27/1464* (2013.01); *H01L 27/14634* (2013.01); *H01L 27/14641* (2013.01); *H01L 27/14621* (2013.01); *H01L 27/14627* (2013.01)

(58) Field of Classification Search
CPC ................... H01L 27/14609; H01L 27/14647; H01L 27/14634; H01L 27/1464; H01L 27/14641; H01L 27/14621; H01L 27/14627
USPC ....................................................... 257/292
See application file for complete search history.

(56) References Cited

U.S. PATENT DOCUMENTS

| 7,893,468 | B2 | 2/2011 | Gambino et al. | |
|---|---|---|---|---|
| 2009/0008532 | A1* | 1/2009 | Setoguchi | H01L 27/14603 250/208.1 |
| 2010/0020209 | A1* | 1/2010 | Kim | 348/294 |
| 2013/0161774 | A1* | 6/2013 | Okigawa | 257/432 |

FOREIGN PATENT DOCUMENTS

| JP | 2010187214 A1 * | 8/2010 | .................... 257/432 |
|---|---|---|---|
| KR | 10-2007-0083300 | 8/2007 | |

(Continued)

OTHER PUBLICATIONS

International Search Report for International Application No. PCT/KR2012/009409, dated May 9, 2013.

*Primary Examiner* — Fernando L Toledo
*Assistant Examiner* — Neil Prasad
(74) *Attorney, Agent, or Firm* — IP & T Group LLP

(57) ABSTRACT

The present invention relates to a substrate stacked image sensor having a dual detection function, in which when first to fourth photodiodes are formed in a first substrate, a fifth photodiode is formed in a second substrate, and the substrates are stacked and combined with each other, the first to fourth photodiodes and the fifth photodiode are combined with each other to obtain a complete photodiode as an element of one pixel, and signals individually detected in each photodiode are selectively read or added to be read according to necessity. To this end, the first to fourth photodiodes are formed in the first substrate, the fifth photodiode is formed in the second substrate, the first to fourth photodiodes and the fifth photodiode make electrical contact with each other, and pixel array sizes of the first substrate and the second substrate are allowed to be different from each other, so that sensor resolution of the first substrate and sensor resolution of the second substrate are different from each other.

13 Claims, 9 Drawing Sheets

(56) References Cited

FOREIGN PATENT DOCUMENTS

| KR | 10-2009-0117437 | 11/2009 |
| KR | 10-2011-0069889 | 6/2011 |
| KR | 10-2010-0015632 | 8/2011 |
| KR | 10-2010-0046400 | 11/2011 |
| KR | 10-2010-0053959 | 12/2011 |

\* cited by examiner

SUBSTRATE STACKED IMAGE SENSOR HAVING A DUAL DETECTION FUNCTION

TECHNICAL FIELD

The present invention relates to a substrate stacked image sensor, and particularly, to a substrate stacked image sensor in which a partial structure of an image sensor pixel is formed in substrates different from each other, and the substrates are three-dimensionally stacked and bonded to each other to complete pixels, and more particularly, to a substrate stacked image sensor having a dual detection function, in which when first to fourth photodiodes are formed in a first substrate, a fifth photodiode is formed in a second substrate, and the substrates are stacked and combined with each other, the first to fourth photodiodes and the fifth photodiode are combined with each other to obtain a complete photodiode as an element of one pixel, and signals individually detected in each photodiode can be selectively read or added to be read according to necessity.

BACKGROUND ART

A background technology for a substrate stacked image sensor will be described in two aspects. One is an aspect according to stacking of a semiconductor integrated circuit, and the other is miniaturization of an image sensor.

Hereinafter, a conventional technology for the stacking of the semiconductor integrated circuit will be described. As the semiconductor integrated circuit is continuously manufactured in a micro size, a packaging technology has also been continuously developed in order to satisfy a demand for miniaturization and mounting reliability. Recently, there have been developed various technologies for substrate stacking with a three-dimensional (3D) structure in which two or more semiconductor chips or semiconductor packages are vertically stacked.

An element with a three-dimensional (3D) structure using such substrate stacking is subject to substrate stacking, to a process (thinning) of grinding the rear surface of a stacked substrate in order to reduce the thickness after substrates are stacked, to a subsequent manufacturing process, to a sawing process, and to a packaging process.

An image sensor vertically stacked using such substrate stacking is manufactured by performing separate processes for a first substrate and a second substrate to complete element manufacturing, aligning the two substrates to be folded, and electrically and mechanically bonding the two substrates to each other.

Many conventional technologies of stacking substrates exist in various fields, and various technologies have been attempted by the present applicants. For example, a method, in which an image sensor can be more economically manufactured by omitting a process for bonding, stacking, and etching substrates, is disclosed in Korean Patent Application No. 2010-0015632 filed in Feb. 2, 2010 by the present applicant.

Furthermore, a technology for minimizing a misalignment problem of bonding pads on substrates when bonding the substrates is also disclosed in Korean Patent Application No. 2010-0046400 filed in May 18, 2010 by the present applicant.

Furthermore, a manufacturing method for allowing pads on substrates to protrude in order to facilitate bonding when bonding the substrates is also disclosed in Korean Patent Application No. 2010-53959 filed in Jun. 8, 2010 by the present applicant.

In the background technology according to the miniaturization of an image sensor, with the development of a mobile appliance such as a cellular phone, only when the height of a camera module embedded in the mobile appliance should be reduced and the resolution of an image sensor included in the camera module should be increased, the degree of design in the mobile appliance is increased. By such trend, a pixel size of the image sensor has also been continuously reduced.

Recently, with the development of a semiconductor integrated circuit technology, a pixel can be manufactured with a size of about 1.4 μm×about 1.4 μm approximating to a wavelength band of a visible ray. Therefore, in a conventional front side illumination (FSI) scheme, light incident from an exterior may not be sufficiently collected in photodiodes due to interference of metal lines. In order to solve such a problem, there has also emerged a back side illumination (BSI) image sensor in which photodiodes are arranged as near as possible to a direction in which light is incident.

FIG. 1 schematically illustrates such a BSI image sensor, and three-dimensionally illustrates four unit pixels including red, green, and blue color filters 11, 21, 31, and 41 and photodiodes 12, 22, 32, and 42, respectively. FIG. 2 illustrates only a red pixel among the pixels. It is noted that FIG. 1 to FIG. 3 illustrate only a color filter part and a photodiode part formed in a semiconductor substrate among the pixels constituting the image sensor pixels.

Furthermore, with the continuous development of a semiconductor technology, also in the BSI image sensor, the depth of the pixel reaches about 3 μm to about 5 μm and the width of the pixel is reduced to about 1.1 μm as illustrated in FIG. 2, so that many more pixels can be integrated per unit area. In this case, a signal disturbance phenomenon, which has not been serious in the conventional art, has been a new problem.

Such a problem will be described in more detail with reference to FIG. 3 that is a sectional view of two continuously arranged pixels.

In FIG. 3, light incident through a green color filter 21 generates photoelectrons in a corresponding photodiode 22. Most of the photoelectrons are normally captured in a depletion region (indicated by dotted lines in FIG. 3) of the photodiode 22 connected to the green color filter 21, and form a valid current component. However, a part of the photoelectrons move to a photodiode 12 of an adjacent pixel, wherein the number of the photoelectrons moving to the photodiode 12 increases as the widths of the photodiodes 12 and 22 are narrowed. This represents loss of a signal in the photodiode 22 connected to the green color filter 21, and serves as a unnecessary signal, that is, color noise in the photodiode 12 connected to the red color filter 11. This is called a crosstalk phenomenon. As a result, in a pixel with a depth of about 3 μm to about 5 μm and a narrow width of about 1.1 μm, since the crosstalk phenomenon becomes serious, the advantages of the BSI scheme disappear.

In the case in which the size (interval) of a pixel is about 1.1 μm, the thickness of a substrate is reduced to a thickness equal or less than a half (for example, a substrate thickness of 4 μm→a substrate thickness of 2 μm) thereof in order to reduce the crosstalk phenomenon, resulting in an increase in a ratio in which incident light is not sufficiently absorbed by a silicon photodiode and transmits the photodiode. That is, since quantum efficiency (QE) is reduced, the amplitude of an electrical signal is further reduced. The quantum efficiency (QE) indicates a ratio of charge generated/captured by incident light, that is, incident photons, with respect to the incident light, and is an index related to efficiency by which a light signal is effectively converted into an electrical signal by an image sensor.

Furthermore, in the conventional BSI image sensor, when a thickness is reduced in order to solve the crosstalk, it is well known that most of blue light is absorbed by a photodiode of a first substrate but green light is partially absorbed. Red light is also partially absorbed but the absorption amount is smaller than that of the green light. In addition, the absorption amount of infrared is very small as compared with them.

Since the absorption of light indicates that photons have been converted into charge, there is a problem that quantum efficiency (QE) is reduced in sequence of blue light>green light>red light>infrared. Furthermore, since a non-absorbed light component is absorbed in a part other than a photodiode, is scattered after colliding with metal lines, or deeply transmits a stacked substrate, and finally has no relation to the quantum efficiency, there is a problem that the waste of light occurs.

DISCLOSURE

Technical Problem

Accordingly, the present invention has been made in an effort to solve the problems occurring in the related art, and an object of the present invention is to provide a substrate stacked image sensor having a dual detection function, which has high quantum efficiency while preventing crosstalk.

Another object of the present invention is to provide a substrate stacked image sensor having a dual detection function, in which when first to fourth photodiodes are formed in a first substrate, a fifth photodiode is formed in a second substrate, and the substrates are combined with each other, a pixel array of the first substrate and a pixel array of the second substrate are allowed not to coincide with each other, so that the definition or resolution of the sensor is improved.

Another object of the present invention is to provide a substrate stacked image sensor having a dual detection function, which improves the definition or resolution of a sensor by allowing a size of a unit pixel formed in a first substrate to be different from a size of a unit pixel formed in a second substrate.

Technical Solution

In order to achieve the above object, according to one aspect of the present invention, there is provided a substrate stacked image sensor having a dual detection function, including: first to fourth pixels formed in a first substrate; and a fifth pixel formed in a second substrate and having a size different from sizes of the first to fourth pixels, wherein the first to fourth pixels and the fifth pixel are electrically bonded to each other, and sum of pitches of the first to fourth pixels is allowed to be equal to a pitch of the fifth pixel, so that sensor resolution of the first substrate is different from sensor resolution of the second substrate.

Furthermore, there is provided a substrate stacked image sensor having a dual detection function, including: a first pixel formed in a first substrate; and a second pixel formed in a second substrate and having a size equal to a size of the first pixel, wherein, when the first substrate and the second substrate are bonded to each other, the first pixel and the second pixel are arranged to be offset to each other, so that sensor resolution of the first substrate is different from sensor resolution of the second substrate.

Furthermore, there is provided a substrate stacked image sensor having a dual detection function, including: first to fourth photodiodes and a first pad formed in a first substrate; and a fifth photodiode and a second pad formed in a second substrate, wherein the first to fourth photodiodes and the fifth photodiode are electrically connected to each other by a contact between the first pad and the second pad.

Furthermore, there is provided a substrate stacked image sensor having a dual detection function, including: first to fourth photodiodes and first to fourth transfer transistors formed in a first substrate; and a fifth photodiode and a fifth transfer transistor formed in a second substrate, wherein the first to fourth photodiodes, the fifth photodiode, the first to fourth transfer transistors, and the fifth transfer transistor make electrical contact with one another.

In the present invention, relative distances of objects in an image are calculated using chromatic aberration of RGB or RGB+IR and an external optical system (a lens) through frequency component analysis by a color of the image based on RGB focus data of the second substrate and RG or RG+IR focus data of the first substrate, and through frequency component analysis of the image by a color according to physical distances of upper and lower layers, and are utilized as basic data for restoring a three-dimensional image.

Advantageous Effects

In accordance with a substrate stacked image sensor having a dual detection function according to the present invention, most of blue light, a part of green light, and a part of red light are absorbed by a first photodiode of a first substrate, and a very few of the blue light, a remaining part of the green light, a remaining part of the red light, and infrared are absorbed again by a second photodiode of a second substrate, so that quantum efficiency increases and waste of incident light is minimized.

In accordance with an additional effect of the present invention with such a structure, when two photodiodes of an upper substrate and a lower substrate are positioned at physically different distances on the basis of an external optical system (an external lens), a relative distance of an object finally captured in an image is measured through aberration of three colors (green, blue, and red) of the external lens, frequency component analysis of a captured image of three colors of the upper substrate, and frequency component analysis of a captured image of three colors of the lower substrate, so that basis image data for restoring a three-dimensional image can be produced and utilized for generating a three-dimensional image by a scheme completely different from an existing stereo camera for generating a three-dimensional image.

BRIEF DESCRIPTION OF THE DRAWINGS

The above objects, and other features and advantages of the present invention will become more apparent after a reading of the following detailed description taken in conjunction with the drawings, in which.

BEST MODE FOR THE INVENTION

Figure 1:
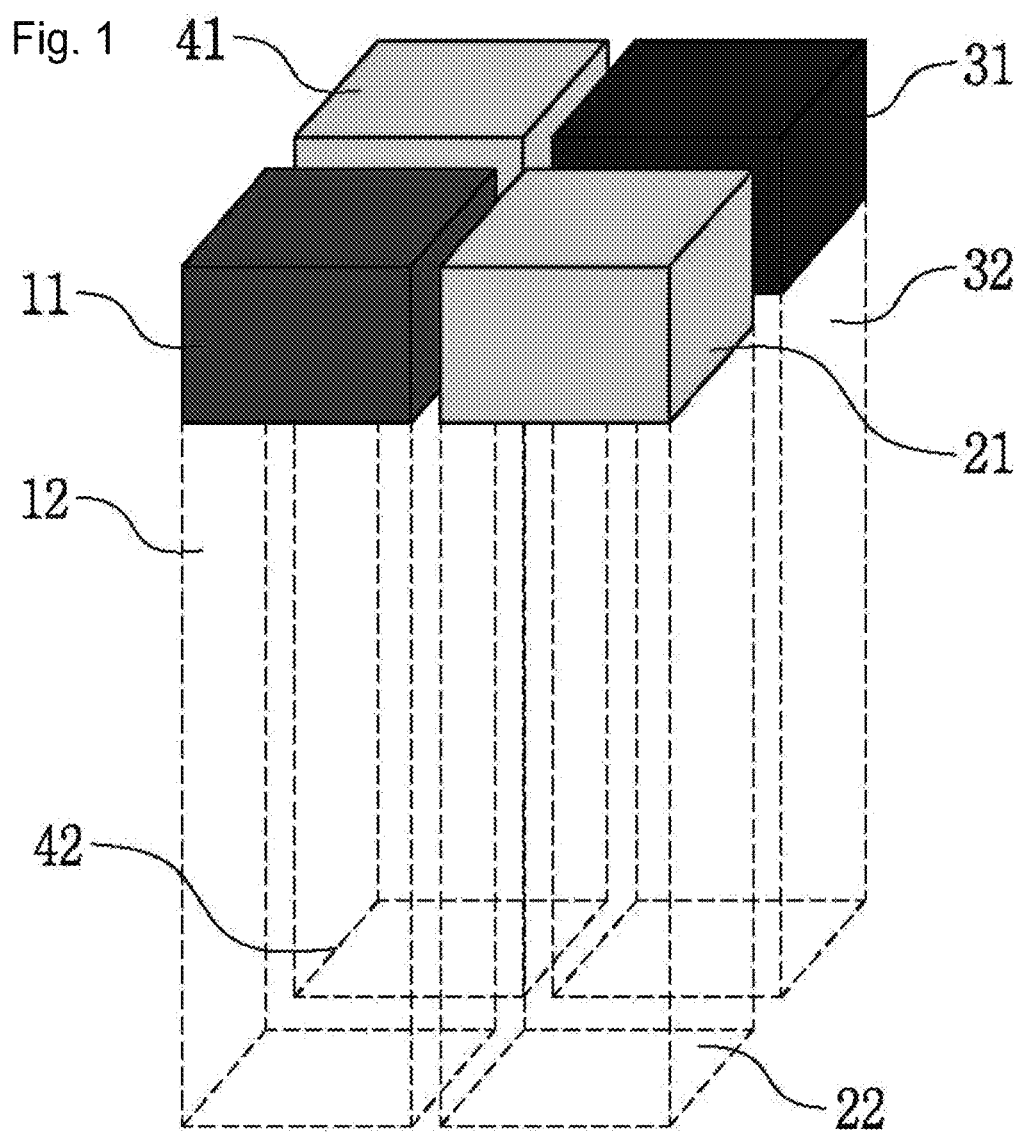
FIG. 1 three-dimensionally illustrates sections of image sensor pixels.
Figure 2:
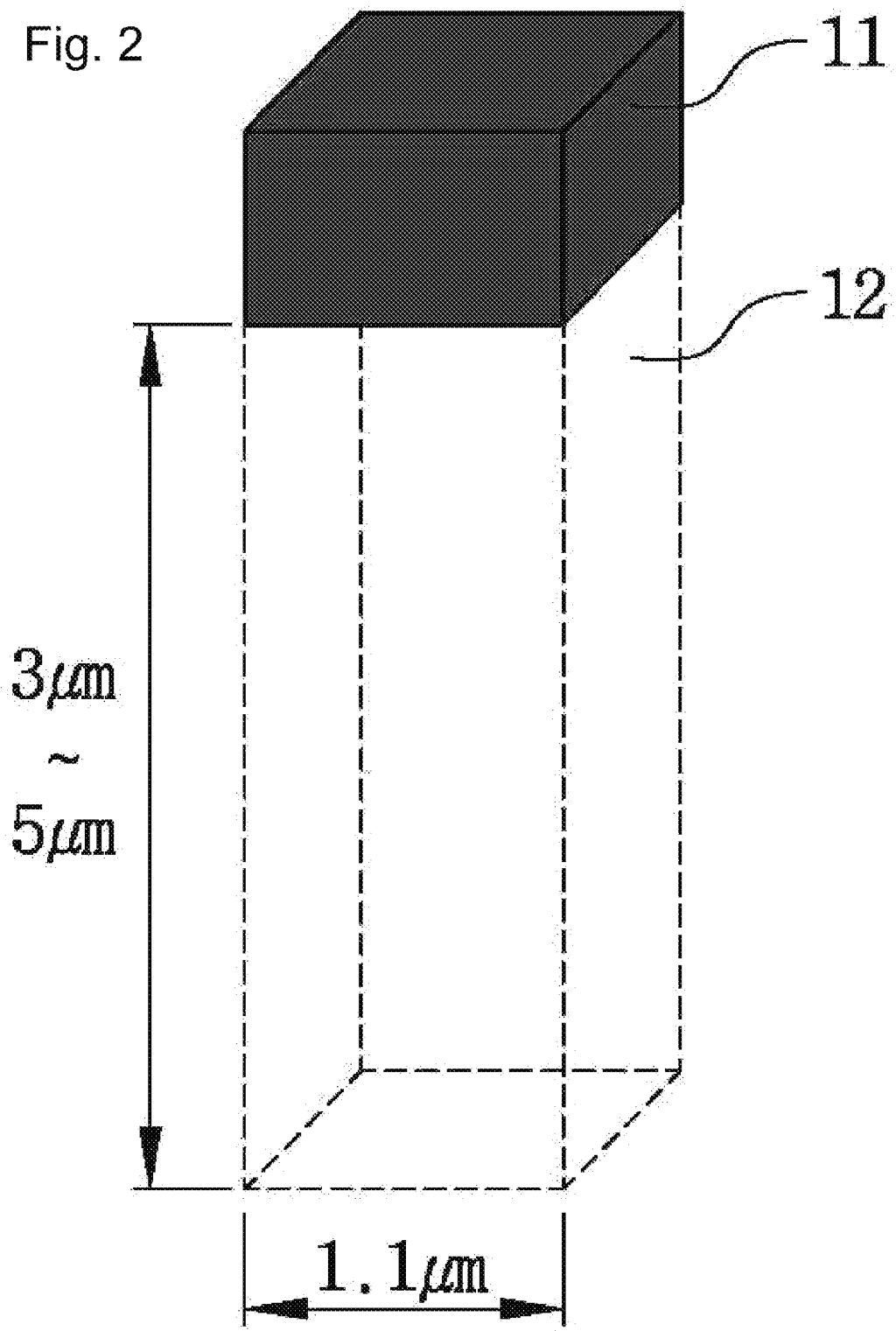
FIG. 2 illustrates a size of only one pixel selected in FIG. 1.
Figure 3:
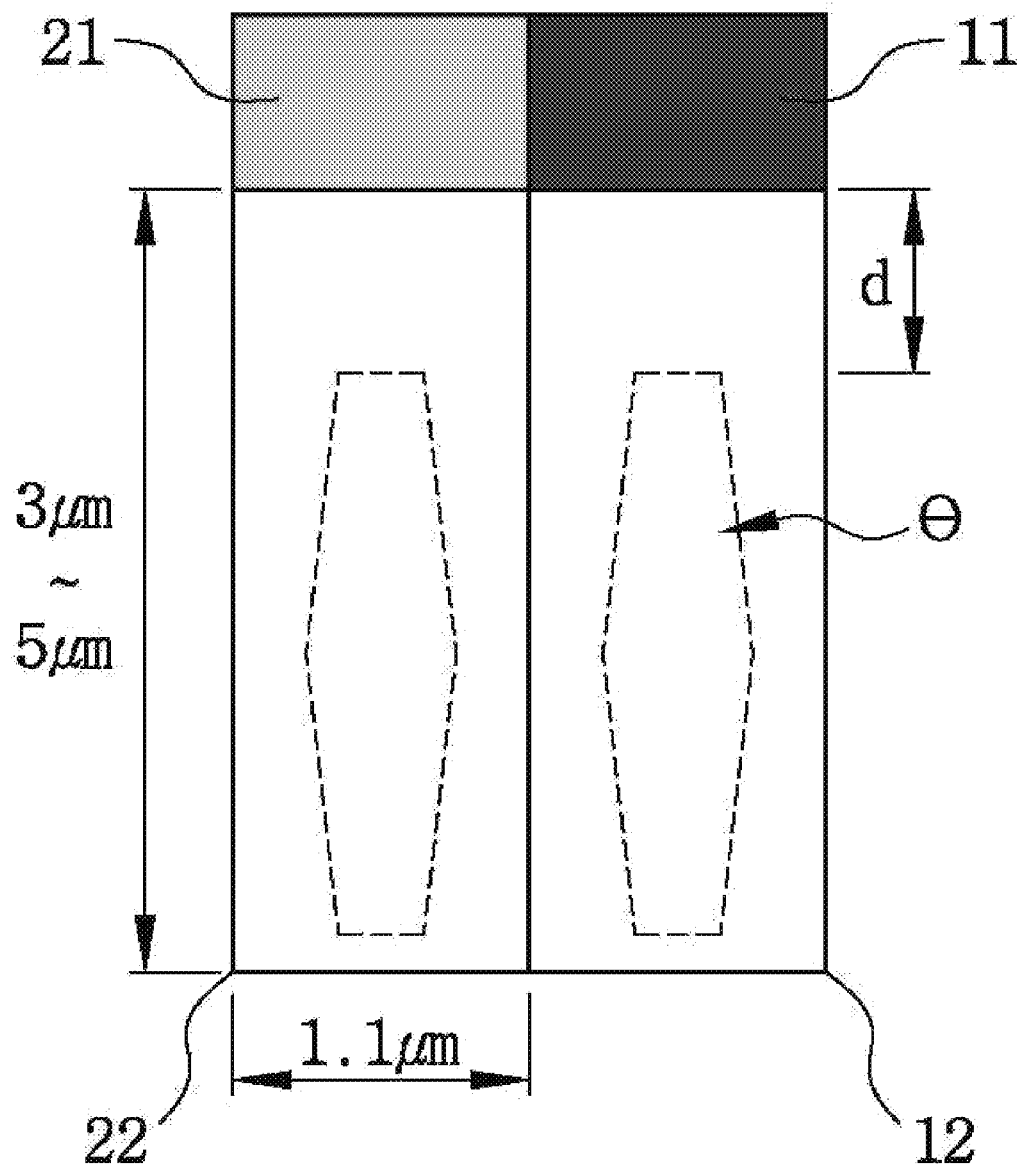
FIG. 3 is a diagram for explaining a crosstalk phenomenon.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 4:
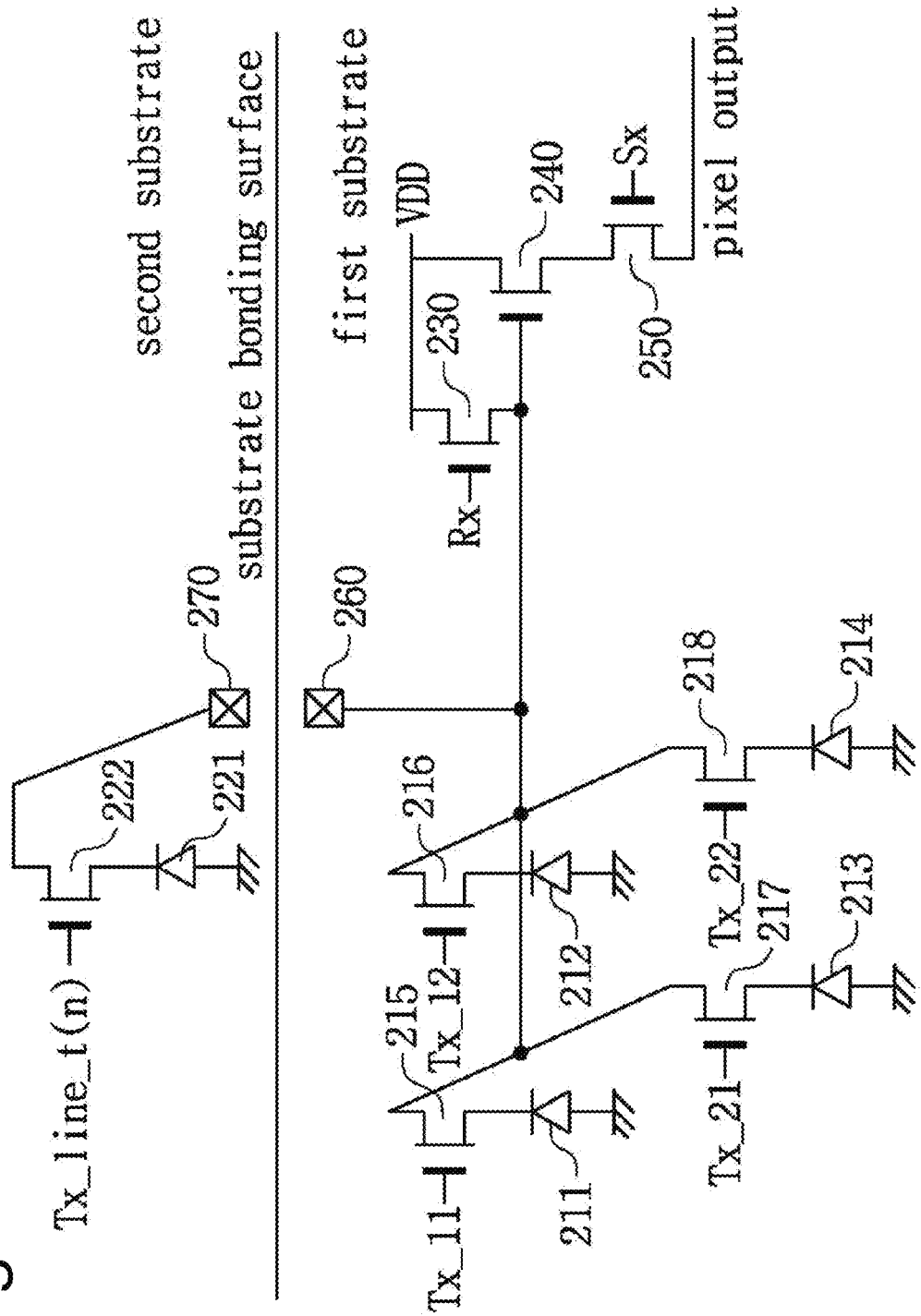
FIG. 4 is a circuit diagram schematically illustrating a structure of a substrate stacked image sensor having a dual detection function according to an embodiment of the present invention.

FIG. 4 is a circuit diagram schematically illustrating a structure of a substrate stacked image sensor having a dual detection function according to the present invention, and as illustrated in FIG. 4, a first substrate includes first to fourth photodiodes 211 to 214, first to fourth transfer transistors 215 to 218, a first pad 260, a reset transistor 230, a tracking transistor 240, and a selection transistor 250, and a second substrate includes a fifth photodiode 221, a fifth transfer transistor 222, and a second pad 270.

Since the first to fifth transfer transistors 215 to 218 and 222, the reset transistor 230, the tracking transistor 240, the selection transistor 250 and the like allow an electrical signal converted by the photodiodes to be pixel output, they are called access transistors.

The elements formed in the first substrate and the elements formed in the second substrate each are manufactured using a well-known semiconductor manufacturing process, one of the two substrates is overturned, and then the two substrates are bonded to each other. At this time, the first pad 260 and the second pad 270 should be exactly aligned such that they are not offset to each other.

According to the main feature of the present invention, when the first to fourth photodiodes 211 to 214 are formed in the first substrate, the fifth photodiode 221 is formed in the second substrate, and then the first substrate and the second substrate are bonded to each other, the first to fourth photodiodes 211 to 214 make electrical contact with the fifth photodiode 221.

The first to fourth transfer transistors 215 to 218 also make electrical contact with the fifth transfer transistor 222 when the first and second substrates are aligned and bonded to each other.

In this case, 'overlapping of the transistors' indicates that gate nodes and drain nodes of two transistors are short-circuited to each other. Of course, it indicates that TX, which is a gate node signal of each transistor, is commonly applied.

Accordingly, by the overlapping, current driving performance also increases by a ratio (W/L ratio) of a width/a length of each transistor. Of course, a circuit designer presets the ratio (W/L ratio) of the width/the length of each transistor based on the fact that driving performance increases by the overlapping.

Furthermore, the gate node signals TX may be separately and independently controlled such that the first to fourth transfer transistors 215 to 218 and the fifth transfer transistor 222 may be selectively controlled according to necessity.

Figure 5:
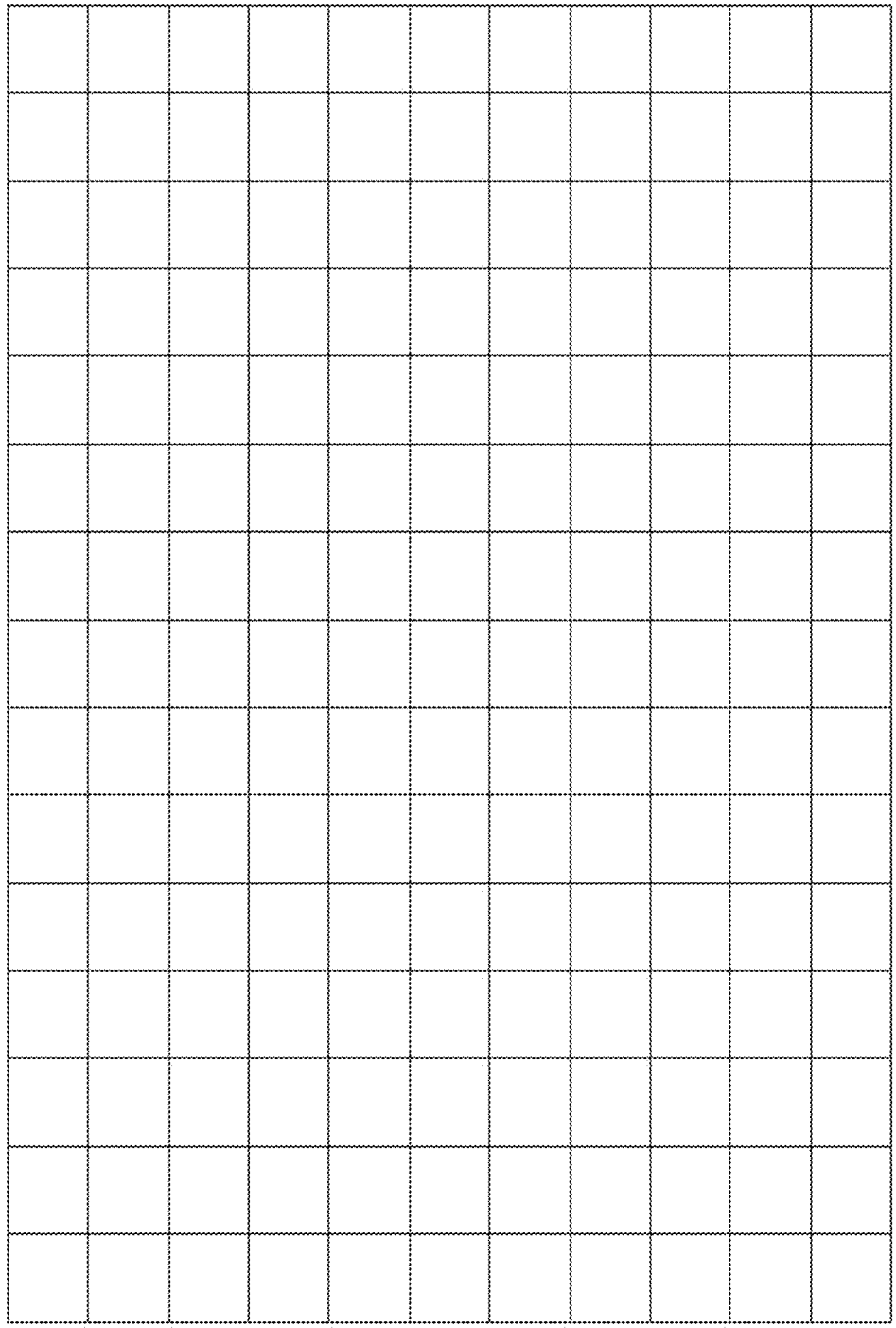
FIG. 5 illustrates a pixel array of a first substrate in the present invention.
Figure 6:
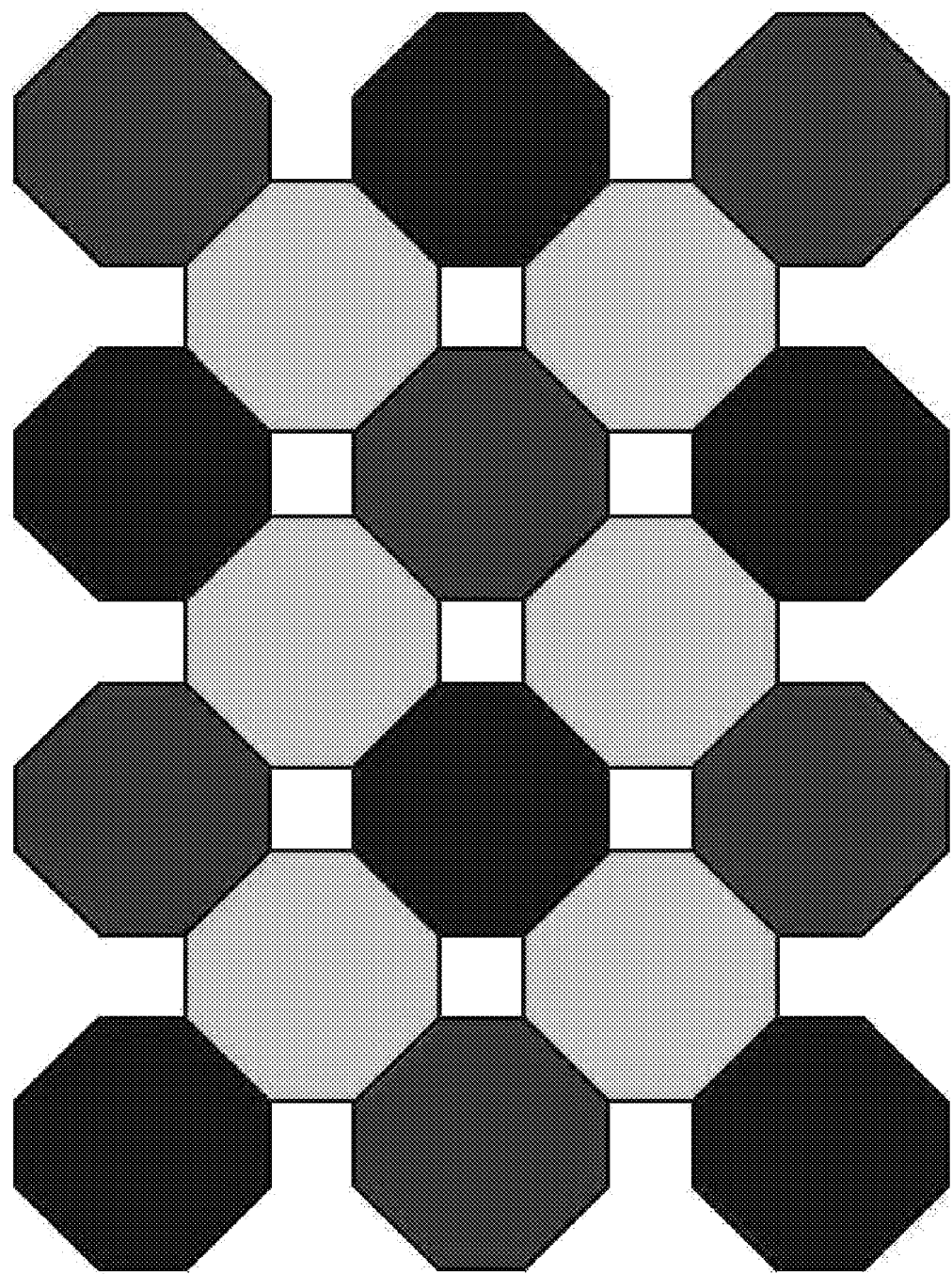
FIG. 6 illustrates a pixel array of a second substrate in the present invention, which has a size different from that of the pixel array of the first substrate.
Figure 7:
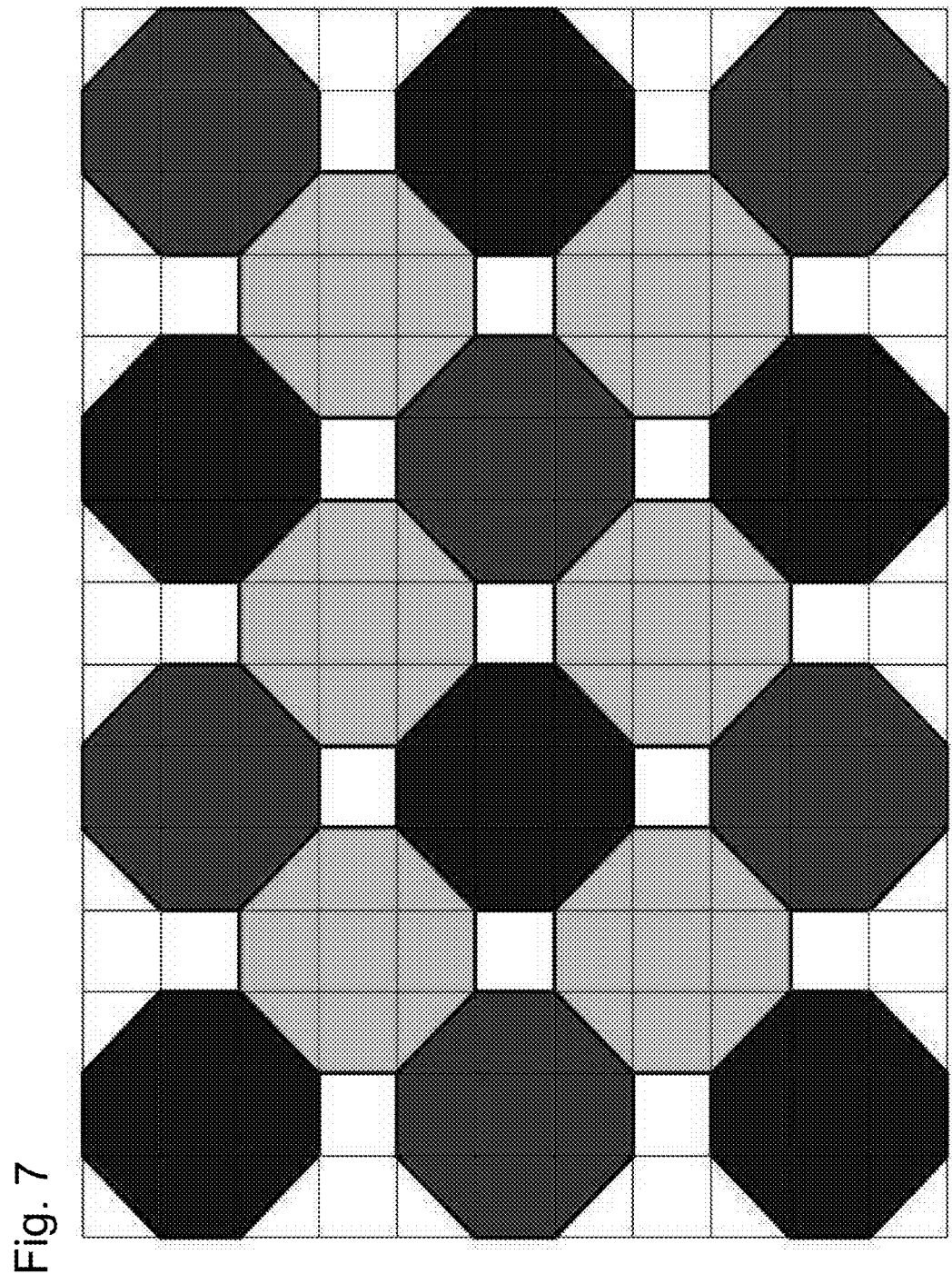
FIG. 7 illustrates a combination of the pixel arrays of FIG. 5 and FIG. 6.

FIG. 5 to FIG. 7 illustrate an embodiment of the present invention, in which a pixel array arrangement of a first substrate and a pixel array arrangement of a second substrate, which have unit pixels with different sizes, are overlap each other.

FIG. 5 illustrates a pixel array and color filters of the first substrate and does not separately illustrate the color filters for the purpose of convenience.

FIG. 6 illustrates a pixel array of the second substrate and illustrates that the size of the unit pixel of the second substrate is different from that of the unit pixel of the first substrate.

FIG. 7 illustrates that the first substrate of FIG. 5 overlap the second substrate of FIG. 6.

Figure 8:
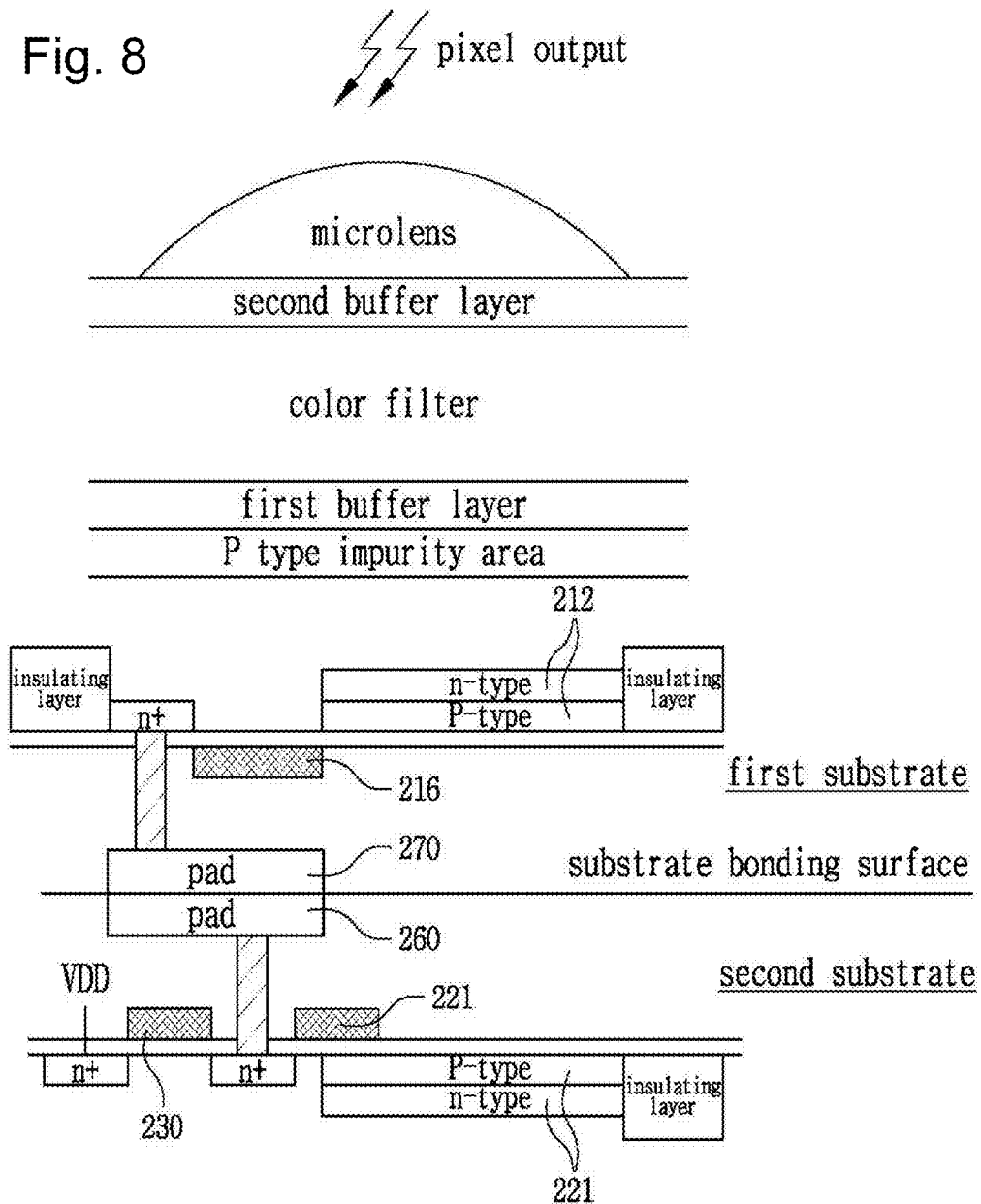
FIG. 8 illustrates a sectional view of combined first substrate and second substrate.

FIG. 8 illustrates a section according to the present invention. Referring to FIG. 8, light incident into the image sensor is generally incident from the rear surface of the first substrate, is collected by a microlens, is selected by color filters via a second buffer layer, and reaches a P-N junction area of the first to fourth photodiodes 211 to 214 via a first buffer layer, a P type impurity area and the like. It is noted that FIG. 8 illustrates only one photodiode for the purpose of convenience. Since an order of the microlens, the second buffer layer, the color filters, the first buffer layer, the P type impurity area and the like is general and is not the main feature of the present invention, a detailed description thereof will be omitted.

When the selected light is blue light B, most of the blue light B is absorbed in the first to fourth photodiodes 211 to 214 and is converted into photocharge. When the selected light is green light G and red light R, a part of the green light G and a part of the red light R are absorbed in the first to fourth photodiodes 211 to 214 and are converted into photocharge.

Light not absorbed in the first to fourth photodiodes 211 to 214 is partially scattered by metal lines (not illustrated), but sufficiently reach the fifth photodiode 221 of the second substrate by continuously transmitting the substrates. Therefore, a very few of the remaining blue light B, a part of the remaining green light G, and a part of the remaining red light R are converted into photocharge again by the fifth photodiode 221.

That is, the detection of light is doubly performed. Particularly, in the case of infrared, due to high transmission property thereof, the amount of photocharge converted by the fifth photodiode 221 may be larger than that converted by the first to fourth photodiodes 211 to 214.

Figure 9:
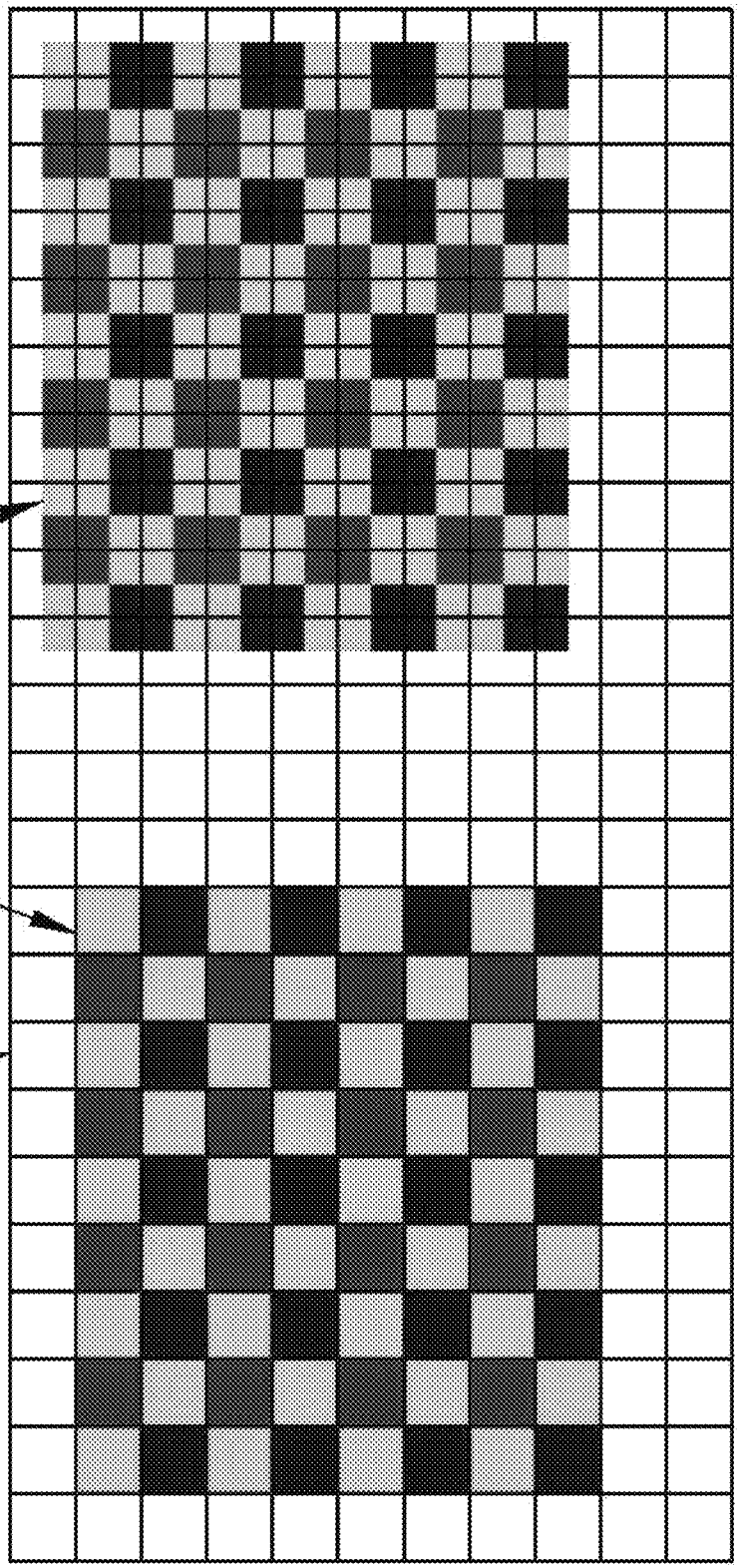
FIG. 9 is a diagram illustrating pixel arrays of the first substrate and the second substrate manufactured not to coincide with each other.

FIG. 9 illustrates another embodiment of the present invention, and is a comparison diagram of the case (the right side), in which a pixel array of a first substrate and a pixel array of a second substrate are bonded not to coincide with each other, and the case (the left side) in which the pixel array of the first substrate and the pixel array of the second substrate are bonded to coincide with each other.

When the first substrate and the second substrate are illustrated in the left side of FIG. 9, a pixel of a lower substrate, which corresponds to a pixel of an upper substrate into which blue light B is incident, does not almost receive light.

The reason for this is because all the blue light B is absorbed in an upper side.

Since a relatively large amount of green light G may be obtained in the lower substrate and a relatively large amount of red light R may be obtained in the lower substrate as compared with the green light G, ununiform data values are obtained, respectively.

When the first substrate and the second substrate are illustrated in the right side of FIG. 9, since the states of all pixels in the second substrate are equal to one another, pixel data of the second substrate is available as a Y value, so that it is possible to generate a base value for improving resolution.

Color filters for separating the blue light B, the green light G, and the red light R are separately provided.

According to another feature of the present invention, relative distances of objects in an image can be calculated using chromatic aberration of RGB or RGB+IR and an external optical system (a lens) through frequency component analysis by a color of the image based on RGB focus data of the second substrate and RG or RG+IR focus data of the first substrate, and through frequency component analysis of the image by a color according to physical distances of upper and lower layers, and can be utilized as basic data for restoring a three-dimensional image.

As well-known in the art, the chromatic aberration indicates aberration caused by the difference of refractive indices according to wavelengths. since the chromatic aberration occurs when light with a long wavelength passes through a lens and is focused at a point remote from the lens as compared with another light, when a lens to be used for an optical device is produced, a plurality of lenses are combined with one another in order to correct the chromatic aberration.

The chromatic aberration is generally discovered in a photograph with strong contrast, and an unfocused part is more clearly seen.

Although a preferred embodiment of the present invention has been described for illustrative purposes, those skilled in the art will appreciate that various modifications, additions and substitutions are possible, without departing from the scope and the spirit of the invention as disclosed in the accompanying claims.

The invention claimed is:

1. A substrate stacked image sensor having a dual detection function, comprising:
   first to fourth pixels formed in a first substrate; and
   a fifth pixel formed in a second substrate and having a size different from sizes of the first to fourth pixels,
   wherein the first to fourth pixels and the fifth pixel are electrically bonded to each other, and a sum of pitches of the first to fourth pixels is equal to a pitch of the fifth pixel so that sensor resolution of the first substrate is different from sensor resolution of the second substrate, and
   wherein relative distances of objects in an image are calculated through frequency component analysis for each color from RGB focus data of the second substrate and RG or RG+IR focus data of the first substrate using RGB or RGB+IR and the chromatic aberration of an external optical system, and for each color according to physical distances of upper and lower layers, to be used as basic data for restoring a three-dimensional image.

2. A substrate stacked image sensor having a dual detection function, comprising:
   a first pixel formed in a first substrate; and
   a second pixel formed in a second substrate and having a size equal to a size of the first pixel,
   wherein, when the first substrate and the second substrate are bonded to each other, the first pixel and the second pixel are arranged to be offset to each other so that sensor resolution of the first substrate is different from sensor resolution of the second substrate, and
   wherein relative distances of objects in an image are calculated through frequency component analysis for each color from RGB focus data of the second substrate and RG or RG+IR focus data of the first substrate using RGB or RGB+IR and the chromatic aberration of an external optical system, and for each color according to physical distances of upper and lower layers, to be used as basic data for restoring a three-dimensional image.

3. The substrate stacked image sensor having a dual detection function of claim 1, wherein a sensor resolution of the first substrate and a sensor resolution of the second substrate are different from each other by a contact between the first to fourth pixels and the fifth pixel.

4. A substrate stacked image sensor having a dual detection function, comprising:
   first to fourth photodiodes and a first pad formed in a first substrate; and
   a fifth photodiode and a second pad formed in a second substrate,
   wherein the first to fourth photodiodes and the fifth photodiode are electrically connected to each other by a contact between the first pad and the second pad so that sensor resolution of the first substrate is different from sensor resolution of the second substrate, and
   wherein relative distances of objects in an image are calculated through frequency component analysis for each color from RGB focus data of the second substrate and RG or RG+IR focus data of the first substrate using RGB or RGB+IR and the chromatic aberration of an external optical system, and for each color according to physical distances of upper and lower layers, to be used as basic data for restoring a three-dimensional image.

5. A substrate stacked image sensor having a dual detection function, comprising:
   first to fourth photodiodes and first to fourth transfer transistors formed in a first substrate; and
   a fifth photodiode and a fifth transfer transistor formed in a second substrate,
   wherein the first to fourth photodiodes, the fifth photodiode, the first to fourth transfer transistors, and the fifth transfer transistor make electrical contact with one another so that sensor resolution of the first substrate is different from sensor resolution of the second substrate, and
   wherein relative distances of objects in an image are calculated through frequency component analysis for each color from RGB focus data of the second substrate and RG or RG+IR focus data of the first substrate using RGB or RGB+IR and the chromatic aberration of an external optical system, and for each color according to physical distances of upper and lower layers, to be used as basic data for restoring a three-dimensional image.

6. The substrate stacked image sensor having a dual detection function of claim 1, wherein the first substrate is three-dimensionally stacked on the second substrate.

7. The substrate stacked image sensor having a dual detection function of claim 2, wherein the first substrate is three-dimensionally stacked on the second substrate.

8. The substrate stacked image sensor having a dual detection function of claim 4, wherein the first substrate is three-dimensionally stacked on the second substrate.

9. The substrate stacked image sensor having a dual detection function of claim 5, wherein the first substrate is three-dimensionally stacked on the second substrate.

10. The substrate stacked image sensor having a dual detection function of claim 1, wherein the external optical system includes a lens.

11. The substrate stacked image sensor having a dual detection function of claim 2, wherein the external optical system includes a lens.

12. The substrate stacked image sensor having a dual detection function of claim 4, wherein the external optical system includes a lens.

13. The substrate stacked image sensor having a dual detection function of claim 5, wherein the external optical system includes a lens.

* * * * *